(12) United States Patent
Wickeraad

(10) Patent No.: US 7,602,629 B2
(45) Date of Patent: Oct. 13, 2009

(54) CONTENT ADDRESSABLE MEMORY

(75) Inventor: John A. Wickeraad, Granite Bay, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 91 days.

(21) Appl. No.: 11/787,588

(22) Filed: Apr. 17, 2007

(65) Prior Publication Data

US 2008/0259667 A1 Oct. 23, 2008

(51) Int. Cl.
*G11C 15/00* (2006.01)

(52) U.S. Cl. ............... 365/49.1; 365/49.11; 365/49.12; 365/49.19

(58) Field of Classification Search ............... 365/49.1, 365/49.11, 49.12, 49.13, 49.5, 49.16, 49.17, 365/49.18, 49.19
See application file for complete search history.

(56) References Cited

U.S. PATENT DOCUMENTS

| | | | |
|---|---|---|---|
| 6,977,831 B2 * | 12/2005 | Hatsch et al. | 365/49.17 |
| 6,999,331 B2 | 2/2006 | Huang | |
| 7,064,971 B2 | 6/2006 | Shau | |
| 7,401,180 B1 * | 7/2008 | James et al. | 711/108 |

\* cited by examiner

*Primary Examiner*—Hoai V Ho
*Assistant Examiner*—Anthan T Tran

(57) ABSTRACT

Systems, devices, and methods, including executable instructions are provided for content addressable memory (CAM). One method includes writing entries, including a type field, to a ternary content addressable memory (TCAM). The method includes marking certain entries as valid. The method includes precharging match lines associated with the entries when an entry is valid and based on a type selection.

17 Claims, 10 Drawing Sheets

CONTENT ADDRESSABLE MEMORY

BACKGROUND

Content address memory (CAM) is a useful device for executing table lookup operations. Particularly, because of the parallel lookup capability, a user can execute thousands or even millions of comparisons with one lookup operation.

For computer systems, CAM is widely used as the address lookup table (called cache TAG) for cache memory, or as the paging translation look-aside table (TLB). For communication applications, CAM is widely used to support address lookup operations for routers. Recently, the rapid growth of networking systems triggered strong demands for high density and high speed CAM devices. For networking applications ternary content addressable memory (TCAM) is used to store various items such as quality of service (QoS) information, filter information, access control lists (ACL), etc. A current TCAM for networking application has 256K of 72 bit entries supporting 125 million lookups per second (LPS). However, due to the parallel lookup operation of CAM devices, the power consumption of a CAM device increases linearly with its density and lookup rate. Compared to most other integrated devices the power density is of CAM device is much higher.

In the mean time, the cost of each CAM device increases exponentially with its area. The power consumption and costs of CAM devices are becoming the limiting factors for current router systems. It is simply too expensive and requires too much power to put enough CAM devices on router systems to support desired performances.

DETAILED DESCRIPTION

Figure 1A:
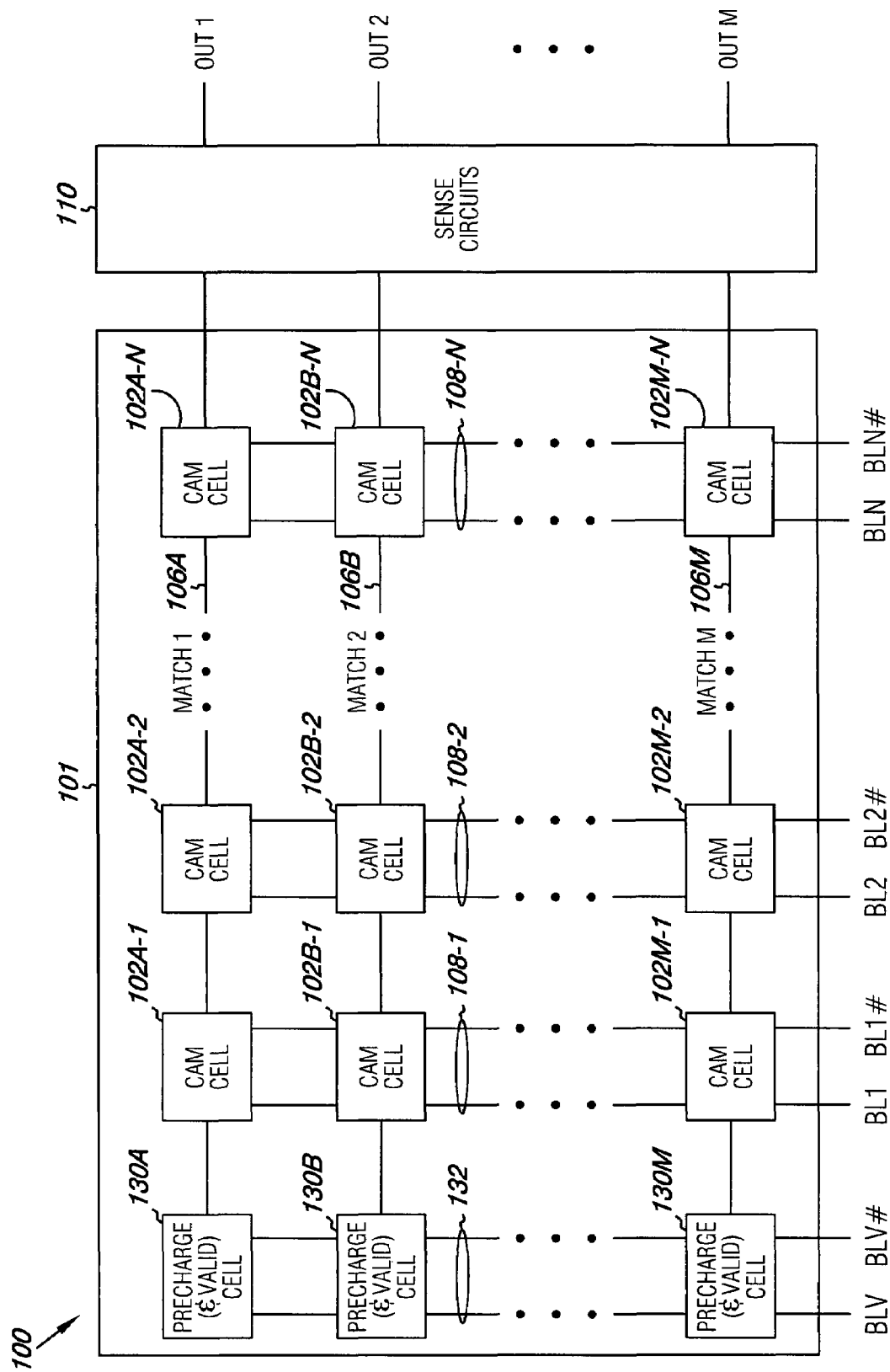
FIG. 1A illustrates an example of a content addressable memory (CAM) system.

Embodiments of the present disclosure include systems, methods, and computer readable media for content addressable memory (CAM) devices, and more particularly to power saving methods for CAM integrated circuits (IC). As used herein a CAM can be either a binary CAM or a ternary CAM. Some embodiments may include writing entries, including a type field, to a ternary content addressable memory (TCAM). Some embodiments include marking certain entries as valid and precharging match lines associated with the entries when an entry is valid and based on a type selection.

In one embodiment, the method includes dividing a TCAM into a number of different groups, each group having a number of entries and a type select input. A number of group enable bits are generated for each group based on the number of entries in the group and based on examining the type field of each entry as entries are written into each group. The number of group enable bits is generated for each different value to the type field and the number of group enable bits for each different value to the type field is stored in a separate memory.

In another embodiment, the method includes dividing the TCAM into a first portion and a second portion. The first portion includes the type field of a given entry and the second portion includes a remainder of the given entry.

As the reader will appreciate, various embodiments described herein can be performed by software, application modules, application specific integrated circuit (ASIC) logic, and/or executable instructions operable on the systems and devices shown herein or otherwise. "Software", as used herein, includes a series of executable instructions that can be stored in memory and executed by the hardware logic of a processor (e.g., transistor gates) to perform a particular task. Memory, as the reader will appreciate, can include random access memory (RAM), read only memory (ROM), non-volatile memory (such as Flash memory), etc.

An "application module" means a self-contained hardware or software component that interacts with a larger system. As the reader will appreciate a software module may come in the form of a file and handle a specific task within a larger software system. A hardware module may be a separate set of logic, e.g., transistor/circuitry gates, that "plug-in" as a card, appliance, or otherwise, to a larger system/device.

The embodiments of the present disclosure may be implemented in a stand-alone computing system or a distributed computing system. As such, FIGS. 1-6 are intended to provide a context for the description of the functions and operations of the present disclosure. Logic, suitable for carrying out embodiments of the present invention, can be resident in one or more devices or locations or in several devices and/or locations in a network. A "distributed computing network" means the use of multiple computing devices in a network to execute various roles in executing instructions, e.g., application processing, etc.

FIG. 1A is a block diagram of a content addressable memory (CAM) system 100. FIG. 1A illustrates a CAM array 101 coupled to sense circuits 110. CAM array 101 is a two-dimensional array of M rows by N columns of CAM cells, e.g., 102A-1, 102A-2, . . . , 102M-N. Each row of the CAM array includes N cells that collectively store data for an entry in the array. Each row is also associated with a respective precharge/valid cell, e.g., 130A, 130B, . . . , 130M used to precharge, and optionally validate, a respective entry in the CAM array. Each row is further associated with a respective match line, e.g., 106-A, 106-B, . . . , 106-M (MATCH 1, MATCH 2, etc.), that couples to all CAM cells in the row and further couples to sense circuits 110.

Each of the N columns of the CAM array is associated with a specific bit position of an N-bit input search data pattern (e.g., can represent an address, port, etc.). A differential data line pair, 108-1, 108-2, . . . , 108-N (e.g., BL1-BL1#, BL2-

BL2#, BLN-BLN#), is provided for each compare data bit and couples to all cells in the corresponding column of the CAM array. The naming convention of adding a "#" at the end of a label to indicate an active low signal is employed throughout the text and figures of this application. In this way, each bit of the N-bit input search data pattern may be compared with each of the M bits stored in the M cells in the corresponding column. The N-bit input search data pattern may thus be provided to all M rows of the CAM array and simultaneously compared against all entries in the array. The differential data lines, 108-1, 108-2, ..., 108-N, can also be used to write data into a given cell in the CAM array. Similarly, a differential validation line pair, 132, (e.g., BLV-BLV#) is provided for each precharge/valid cell and couples to all such cells in the corresponding column of the CAM array.

Before performing the comparison between the input search data pattern and the entries in the CAM array, the M match lines (also referred to as "hit lines") for the M rows of the array are pre-charged to logic high (e.g., VDD). For each row, if any cell in the row is not matched to the corresponding address bit, then the output transistor for that cell is turned ON and the match line is pulled to logic low (e.g., VSS, or reference potential). Thus, for any given row, the match line remains at logic high (i.e., not pulled to VSS) only if the output transistors for all N cells in the row are turned OFF, which only occurs if each bit for the input search data pattern matches the bit in the corresponding cell of the row. The match line for each row is thus at logic high for a match between the entry in that row and the input search data pattern, and is at logic low if there is no match (i.e., a mismatch) between the entry and the input search data pattern.

Figure 1B:
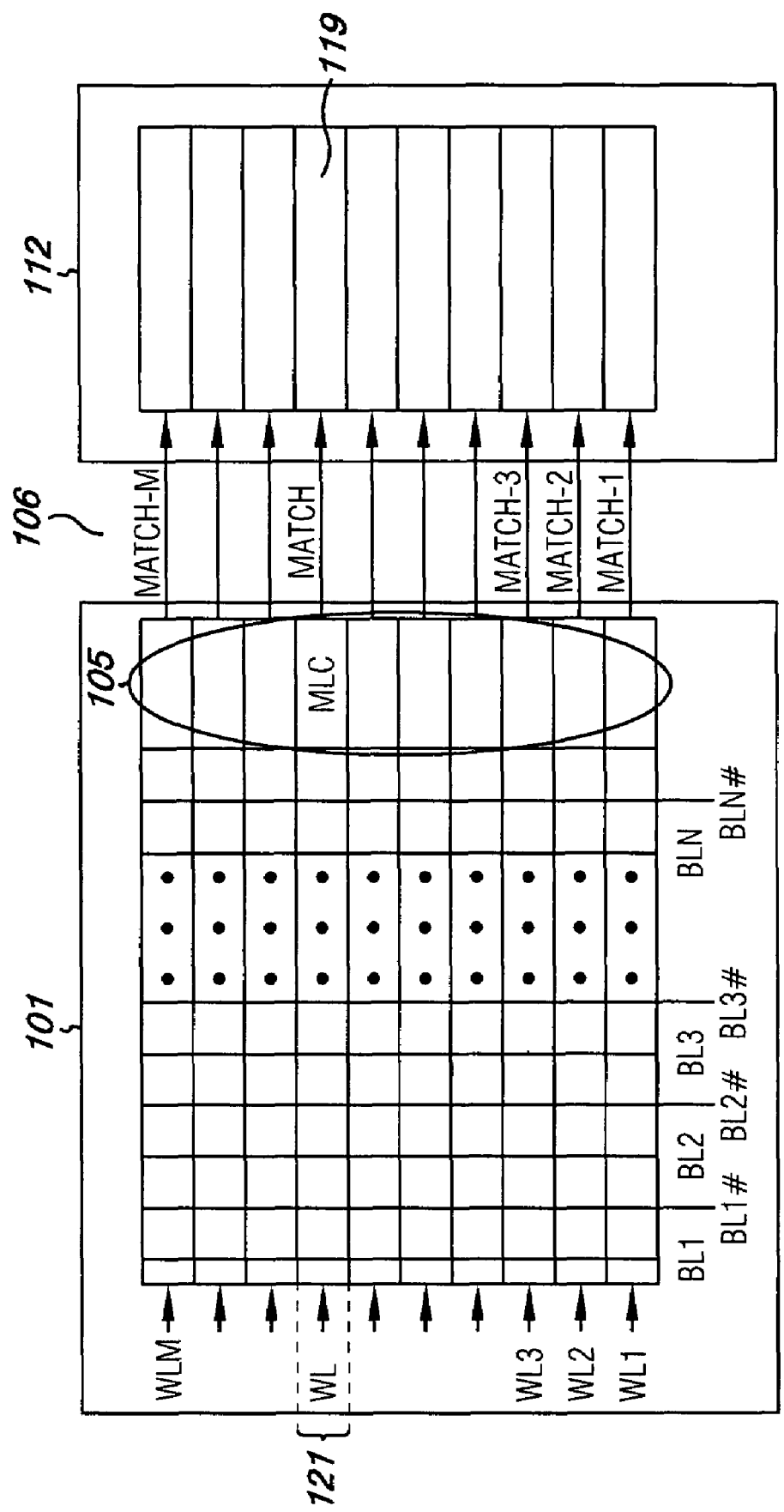
FIG. 1B is a symbolic block diagram showing the overall structure of a CAM device.

The symbolic block diagram in FIG. 1B illustrates the overall structure of CAM devices. That is, a CAM device includes a CAM array 101 connected to a memory array 112 such as a random access memory (RAM). Instead of 112 being a memory element it could also be a match line encoder giving an indication of whether a match occurred or not and indicating the address of the match. Each row 119 of the RAM array 112 stores data corresponding to each entry 121 of the CAM array 101. The CAM array 101 includes a number of CAM entries 121 similar to the CAM entry 121 illustrated in FIG. 1C. The CAM entries 121 along the same column share the same set of bit line pairs, e.g., BL1-BL1#, BL2-BL2#, ... BLN-BLN#, so that data comparisons can be executed on all the entries simultaneously. Each CAM entry has its own word line, e.g., WL1, WL2, ..., WLM, for selecting individual entry for data write/read operations. Each CAM entry has an output, e.g., "match" shown as MATCH-1, MATCH-2, ..., MATCH-M indicating the results of comparison. This output MATCH is used to select corresponding data row 119 in the RAM array 112. Since the data stored in each entry is different from the data stored in all other entries, for each lookup operation, only one or none of the entries can have a matched result for a binary CAM. The resulting match signal is used to select one or none rows of data from the RAM array 112 as the output for further operations.

Figure 1C:
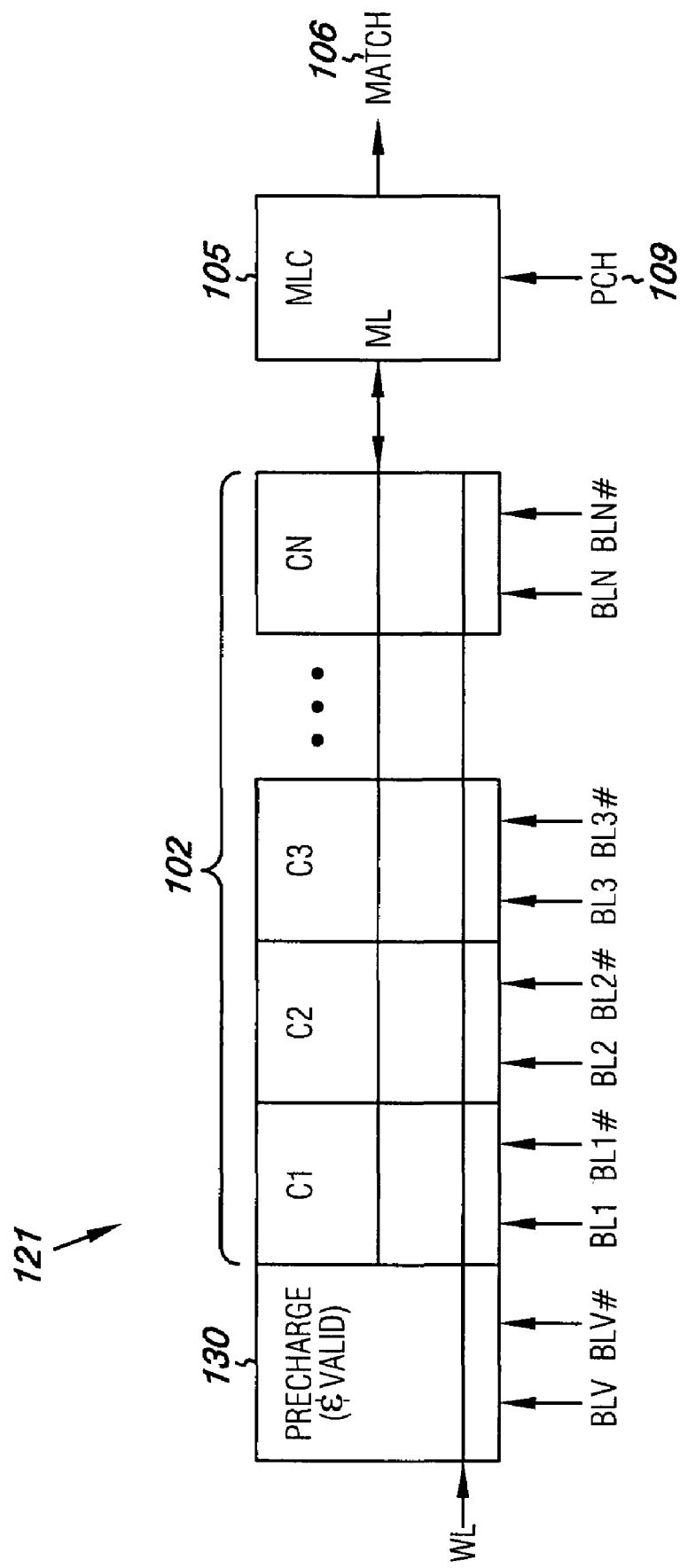
FIG. 1C illustrates a CAM entry, e.g., of a CAM device as shown in FIG. 1B.

The CAM entry 121 in FIG. 1C illustrates a number of CAM cells 102, e.g., C1, C2, ..., CN, arranged in a row. Each cell, C1, C2, ..., CN, in an entry has its own bit line pair, BL1-BL1#, BL2-BL2#, ... BLN-BLN#, while sharing the same word line WL and the same match line (ML) with other CAM cells in the same entry. A set of N-bit binary data can be written into or read from the storage nodes of these CAM cells by activating the word line WL in the same manner as a static random access memory (SRAM) operation. Simultaneous N-bit comparison can be executed by placing the N-bit comparison data into those N pairs of bit lines. If one or more than one bit of the N-bit inputs are different from the stored data, the match line (ML), which may be precharged to be active "high," is pulled "low," e.g., discharged, by the exclusive OR (XOR) structures in the CAM cells with mismatched data. If all bits in the CAM entry matches, the match line remains at a high impedance state because all the XOR structure in the CAM cells are at high impedance states. As shown in FIG. 1C, the match line (ML) is connected to a match line logic circuit (MLC) 105. One example, of an approach to a MLC 105 is described in connection with FIG. 1E.

Figure 1D:
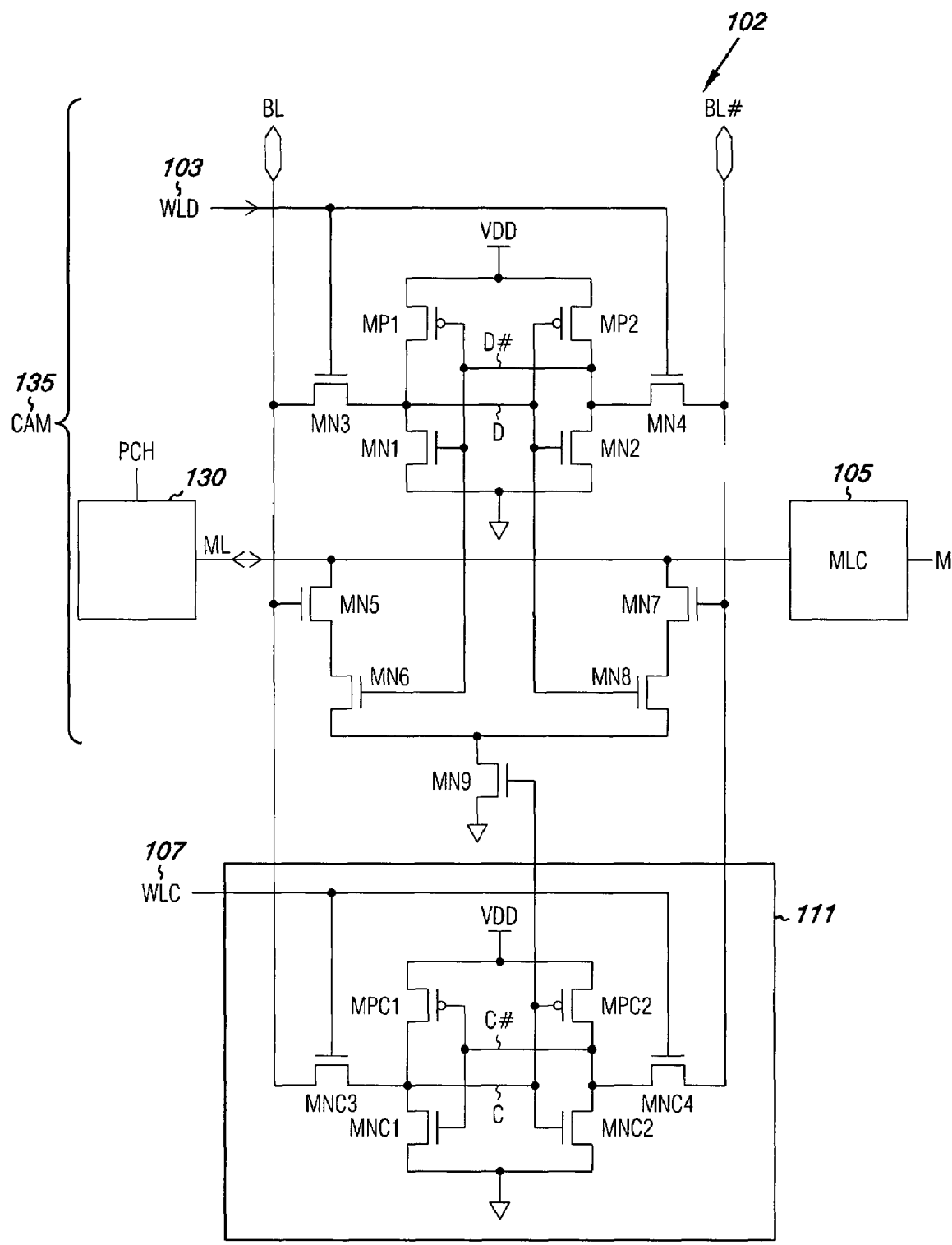
FIG. 1D shows a ternary CAM (TCAM) cell that can support three comparison results—miss/match/"don't care."

FIG. 1D shows an "ternary CAM" (TCAM) cell that can support three comparison results—miss/match/"don't care." The connections of the top 10 transistors (MP1, MP2, and MN1-MN8) operate similar to a binary CAM cell if the sources of MN6 and MN8 were connected to ground.

First the operation of a binary CAM cell portion will be described by looking at only upper (i.e., CAM) portion 135 of the circuit. Two p-channel transistors (MP1, MP2) and two n-channel transistors (MN1, MN2) are connected as back to back inverters to form a bi-stable memory element with two complementary storage nodes (D, D#). One storage node (D) of the memory element is connected to the drain of an n-channel select transistor (MN3). Two complementary data input lines (BL, BL#), e.g., bit line pairs, provide data inputs/outputs to the CAM cell. The source of MN3 is connected to bit line (BL) for data transfer, which its gate is connected to data word line (WLD) for selecting the memory element. The other complementary storage node (D#) of the memory element is connected to the drain of another n-channel select transistor (MN4). The source of MN4 is connected to the complementary bit line (BL#) for data transfer, while its gate is connect to data word line WLD for selecting the memory element.

These 6 transistors (MP1, MP2, MN1, MN2, MN3, and MN4) are arranged in the same manner as a six transistor (6T) static random access memory (SRAM) memory cell. Data can be written into or read from such 6T SRAM cells by putting data on the complementary bit line pair (BL, BL#) while turning on the corresponding data word line (WLD), in the same manner as used in SRAM operations. The additional 4 transistors (MN5-8) in this 10T CAM cell are used for lookup, i.e., "compare," operations. The gate of n-channel transistor MN5 is connected to BL, and its drain is connected to match line signal ML. In a TCAM arrangement, the ML is pre-charged high and then pulled "low" when there is a "mismatch" (difference in data) in the comparison operation.

The gate of n-channel transistor MN6 is connected to storage node D#, and its source is connected to the drain of an n-channel transistor (MN9). The drain of MN6 is connected to the source of MN5. The gate of n-channel transistor MN7 is connected to BL#, and its drain is connected to signal ML. The gate of n-channel transistor MN8 is connected to storage node D, and its source is connected to the drain of an n-channel transistor MN9. The drain of MN8 is connected to the source of MN7. These 4 transistors (MN5-8) perform an exclusive OR (XOR) logic operation between the complementary storage data (D, D#) and the input data placed on the bit line pair (BL, BL#). They have been referred to herein as the "XOR structure" in the present disclosure. If the storage data (D, D#) and the input data (BL, BL#) have different complementary digital values, either the MN5/MN6 or the MN7/MN8 pairs of the XOR structure will form a conducting path to pull the voltage on the match line ML toward ground voltage. The compared result is called a "miss" and/or "mismatched cell" under this condition.

If the storage data (D, D#) and the input data (BL, BL#) have the same complementary digital values, both MN5/

MN6 and MN7/MN8 pairs remain at high impedance state with no signal current flow from the match line (ML) through this CAM cell. The result obtained under this situation is called a "match." One 10T cell in FIG. 1D is therefore capable of performing single bit comparison. A "match" is represented by high impedance state on the match line (ML), while a "miss" is represented by pull down current by the XOR structure of the 10T CAM cell.

By adding the lower seven (7) transistors (MPC1, MPC2, and the five (5) n-channel transistors (MNC1, MNC2, MNC3, MNC4, and MN9)), a TCAM cell is formed. The sources of MN6 and MN8 are connected to the drain of the n-channel transistor MN9 The source of MN9 is connected to ground, while its gate is connected to a storage node (C) of another memory element 111 providing a "don't care" capability of the TCAM. In the example of FIG. 1D, memory element 111 includes two (2) p-channel transistors (MPC1, MPC2) and four (4) n-channel transistors (MNC1, MNC2, MNC3, MNC4) arranged in the same ways as conventional 6T SRAM memory cell. The "don't care" memory element 111 uses its own "care" word line (WLC) 107, as different from the "data" word line (WLD) 103 described above, while it shares the same bit line pairs (BL, BL#) with the CAM storage cell on top of it. When a binary number "1" is written into "care" memory element 111, C is high so that MN9 is conductive; the XOR structure (MN5-MN8) is enabled so that the TCAM cell in FIG. 1D supports the same functions as that of a binary CAM cell. When a binary number "0" is written into memory element 111, C is low so that the XOR structure (MN5-MN8) is always disabled. As such, the comparison result is always a "match." The TCAM cell in FIG. 1D is therefore able to support a "care" and "don't care" state. These TCAM cells can be arranged in the same architectures as those described in FIGS. 1B, 1C, and 1E to form a high density TCAM device supporting simultaneous lookup of large numbers of ternary logic data.

As the reader will appreciate CAMs and TCAMs are power hungry devices. With CAMs there is either 0 or 1 match. With TCAMs there may be multiple matches. Much of the power consumed by the TCAM is due to the match lines being precharged and then discharged during a "compare" operation. Typically, with most compares there are very few entries that "match," e.g., 0-W where W is the bit width of a word being searched The best approximation of the "worst" case power is to have all valid entries miss each compare. This means that all match lines are being charged, and then discharged to indicate no match, every clock cycle under worst case conditions.

By precharging only valid entries, the TCAM is much more power efficient, e.g., does not waste power when the TCAM is mostly empty. Unfortunately, valid entries alone do not help the worst case power when all the TCAM entries are valid. Embodiments which will be described in more detail below allow a chip having a TCAM device/system to be designed for this worst case power usage. Embodiments present different options that leverage an invalid pre-charge disable to reduce the maximum power consumed by the comparison operation by up to 80% or higher for some applications. This can have a significant impact on system costs (power supplies and cooling).

The embodiments can be very effective in power reduction because of the usage model of the TCAM. For example, in networking system applications, the TCAM may be used for different type of compares on each network packet. That is, a TCAM may be used to store various items such as Quality of Service (QoS) information, filter information, access control list (ACL) information, etc. In certain networks, each packet can allow many, (16-32 or more) searches in the TCAM. In certain networks, the maximum rate packets can be processed, e.g., for a minimum size packet, is one packet every particular number ("T") of clock cycles. As noted, each packet can have multiple types of compares done in the TCAM. If packets have more than T different compares done then the TCAM will be doing a compare every cycle when processing minimum size packets. This represents a worst case power situation.

One way to reduce the power consumption would be to divide a large TCAM into several smaller TCAMs and to put each type of compare into a different TCAM. Then each TCAM would be searched only once per packet for each type of search and the power would be reduced because each TCAM would be much smaller (thereby reducing the quantity of entries being precharged) and each TCAM would be searched at a maximum rate of once every T cycles (thereby reducing the number of iterations of precharging the entries). To allow flexibility in the number of searches that are done and how many entries of each type of search are available it is much better to have one large TCAM. This allows the TCAM to dynamically be divided up depending on the mix of types of searches that are important to the application. However, this means that all the valid entries will be searched each compare regardless of type. If only the entries that matched the type for the current search were "valid," then the maximum power could be reduced by approximately $(T-1)/T \times 100\%$ (e.g., if T=5, then the saving would be 80%). For example, assuming T=5, if all the entries were of one type and each packet were to do a search every five (5) clock cycles, then all the entries would be searched 1 out of 5 clock cycles. Or if there were 5 different types of entries filling the TCAM and each packet did 5 searches on the 5 different types, then each entry would be searched once every 5 clock cycles. Either way, each entry would only be searched a maximum of 20% of the clock cycles. Embodiments described below modify the TCAM to allow entries to be searched only under certain conditions, e.g., a compare group invalidate based on entry types in the group and a compare type invalidate based on entry type.

Figure 1E:
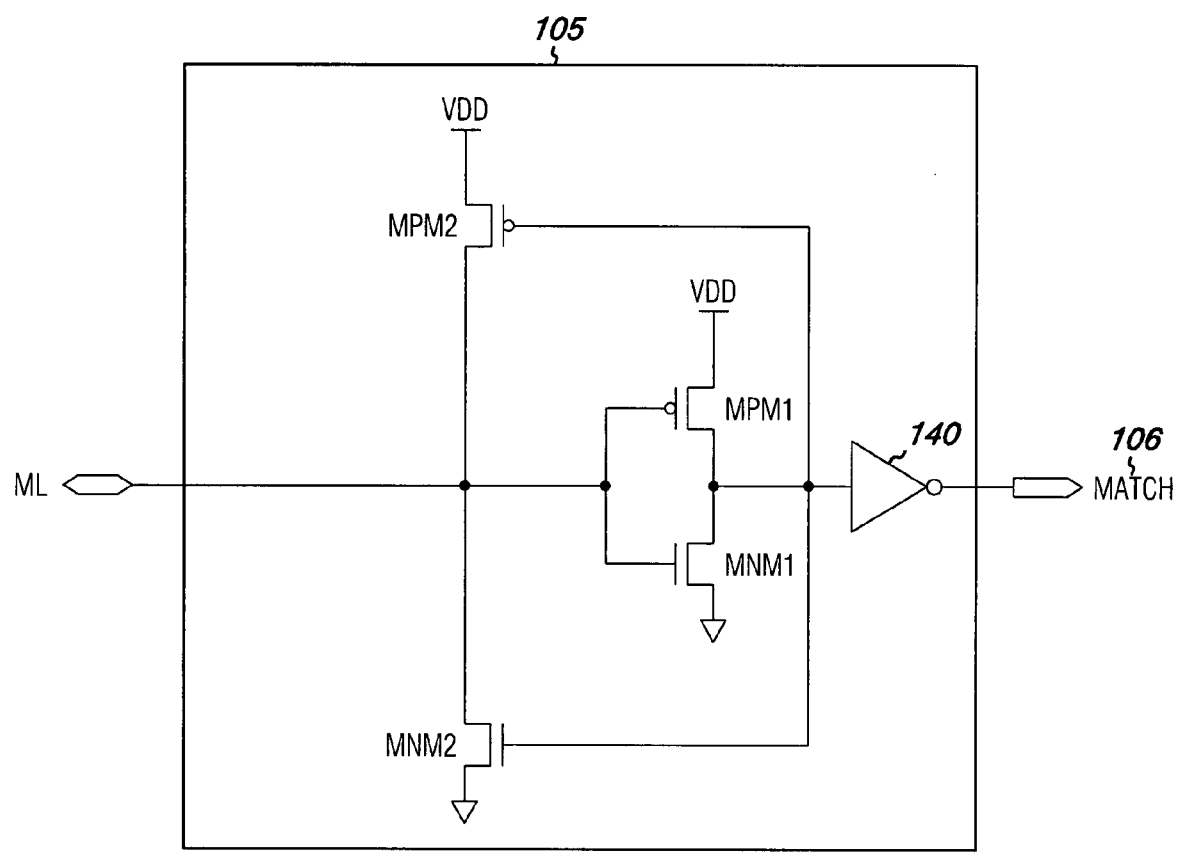
FIG. 1E illustrates an approach to a match line cell (MLC) as described in connection with FIGS. 1B-1D.

FIG. 1E illustrates a previous approach to a MLC 105 described in connection with FIGS. 1B and 1C. As shown in FIG. 1E, a p-channel transistor (MPM1) and an n-channel transistor (MNM1) form an inverter to detect the value of the binary data on the match line (ML) and provide an inverted signal that is input to inverter 140 and inverted again to provide output signal MATCH 106. Another p-channel transistor (MPM2) with weak driving capability and another n-channel transistor (MNM2) with weak driving capability form a feedback inverter to hold the value of the binary data on the match line (ML). Before a lookup, e.g., "compare," operation, in response to a pre-charge signal from e.g., a precharge/valid cell (discussed in connection with FIGS. 2 and 3 below), the match line (ML) initial voltage is driven "high," e.g., pre-charging the match line (ML) "high." To commence a compare operation, with the match line (ML) precharged by a precharge/valid cell and then the match line (ML) is placed in a high impedance state (precharge/valid cell shown in FIG. 1A, and its operation with associated discharge circuitry described next in conjunction with FIGS. 2 and 3), compare data are placed on bit line pairs, BL1-BL1#, BL2-BL2#, . . . , BLN-BLN#. If there are one or more than one bit mis-match on the entry, the match line (ML) is pulled low, which pulls MLC 105 output, e.g., MATCH 106, low. If there is a perfect match, the match line (ML) remains at high voltage, while the output signal (MATCH) also remains high.

Embodiments of the present disclosure are not limited to this example. That is the logic of the n-channel and/or p-channel transistors could be switched to achieve a particular intended functionality and/or architecture. For example, a MLC 105 could pre-charge a match line ML# low and maintain the "active" low state for a "match" and pull the match line (ML) high for a "mis-matched" state. Embodiments are not so limited to the particular logic choice.

Diagrams of the features of a TCAM would look very similar to FIGS. 1A, 1B, and 1C except that rather than a single word line (WL) for each entry there would by a data word line (WLD) and a care word line (WLC) to be able to write both the "care" and "data" portions of the cells. In addition, rather than a memory array 112 (or simple encoder) the TCAM would use a priority encoder to find and encode the address of the highest priority, e.g., first, match.

Figure 2:
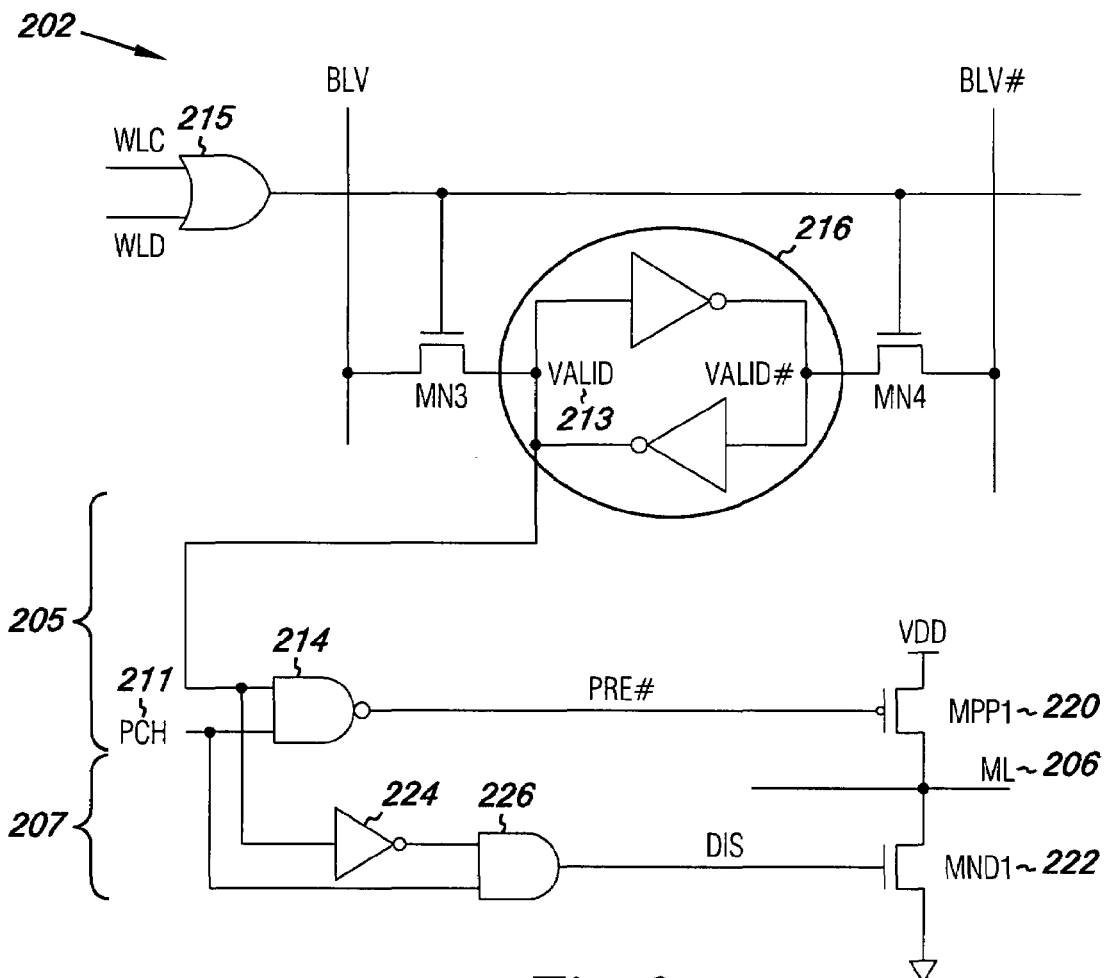
FIG. 2 illustrates a previous logic approach for a valid/precharge cell as part of a TCAM.

FIG. 2 illustrates the logic in a precharge/valid cell found in a previous logic approach to a TCAM. FIG. 2 illustrates that a "write care" WLC signal and a "write data" WLD can be logically OR'd 215 to provide an input signal to the TCAM storage cell 202, e.g., 102 in FIGS. 1A, 1C, and 1D. This is used to read and write the VALID bit that will be used to validate an entry in the CAM or TCAM. As described above, the TCAM storage cell includes a validation bit line pair, BLV-BLV#, for data input/output to the TCAM storage cell. The input signal can control select gates MN3 and MN4 which are coupled to the back to back inverters which form the bi-stable memory element having two complementary storage nodes.

According to the approach illustrated in FIG. 2, the precharge logic circuit 205 would effectively use a NAND gate logic 214 having a pre-charge (PCH) signal input 211 and the VALID, i.e., "care," signal input 213 to determine when to precharge the match line (ML) 206. In the example shown in FIG. 2, if the PCH signal and the VALID signals are "high" then the PRE# signal is "low." This "low" signal is illustrated being provided to a gate of a p-channel transistor (MPP1) 220, turning MPP1 220 ON. MPP1 220 has its source connected to power supply VDD and its drain to the match line (ML) 206 to pre-charge the match line (ML) 206 "high."

However, if the PCH signal is "high" indicating a pre-charge should occur, but the VALID signal is "low," then the PRE# signal will be high, turning MPP1 220 OFF. To ensure the match line (ML) 206 is not left in a high state from a previous compare, discharge circuitry 207 is provided to discharge the match line (ML) 206 when MPP1 220 is OFF. If the PCH signal is "high" indicating a pre-charge should occur, but the VALID signal is "low," the DIS signal output of AND gate logic 226 will be "high," turning ON an n-channel transistor (MND1) 222, discharging the match line (ML) 206 to a reference potential (e.g., ground). If both the PCH signal and the VALID are "high" then the DIS signal is "low," placing MND1 in a high impedance state, and permitting the match line (ML) 206 to be charged.

Figure 3:
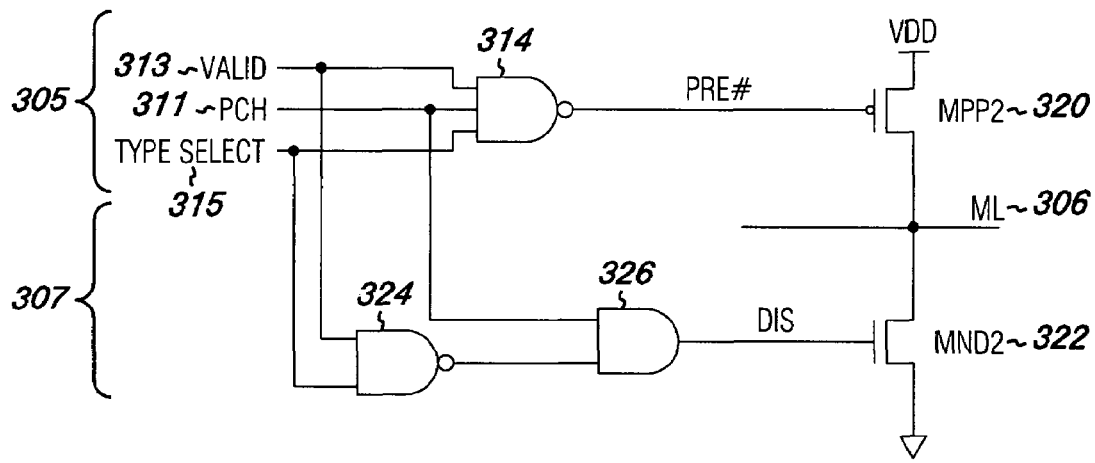
FIG. 3 illustrates an embodiment of logic associated with a valid/precharge cell including a type select input to control precharging match lines associated with CAM.

FIG. 3 illustrates an embodiment of the present invention in which a NAND gate logic 314 is provided with three (3) signals; PCH 311, VALID 313, and a TYPE SELECT signal 315. The TYPE SELECT signal, as described in more detail below, is based on a "type field" of a TCAM entry. One of ordinary skill in the art will appreciate the manner in which a TCAM entry may include a "type field." As the reader will appreciate, in networking system applications each TCAM entry contains data, mask, and a "valid" bit. The data portion of a TCAM entry can be divided up into different fields. One of these several different fields can be chosen, based on a given application, as a "type field" to implement the methods described herein. For different TCAMs this "type field" may have different widths. For example, a particular chip architecture may have an access control list (ACL)/quality of service (QoS) TCAM having a 6-bit type field, a best match prefix (BMP) TCAM having a 1-bit type field or a 7-bit type field (divided into 2 subtypes of 1-bit and 6-bits). Embodiments, however, are not limited to these examples.

These "type" bits are normally processed as part of the compare operation to look for a match, or "hit," in the TCAM. As described above, only the entries matching the type field in the compare data will match. All other "types" will miss, thereby causing the match lines to be discharged (after having been precharged). Repeated pre-charging, then discharging of the match lines due to misses, i.e., non-matches, is what causes much of the power dissipation for compare operations.

As shown in FIG. 3, embodiments of the present disclosure, use the "type field" as part of the precharge/valid logic circuit 305. In the embodiment of FIG. 3, the precharge/valid logic circuit 305 effectively uses a NAND gate logic 314 having a PCH signal input 311, a VALID, i.e., "care," signal input 313, and a TYPE SELECT signal input 315 to drive the signal on a match line (ML) 306. In the example embodiment shown in FIG. 3, if the PCH signal, the VALID signal, and the TYPE SELECT signal input are "high" then a PRE# signal output of the NAND gate 314 is low. This "low" signal is provided to a gate of a p-channel transistor (MPP2) 320 turning MPP2 320 ON. In this example logic embodiment, MPP2 320 has its source connected to power supply VDD and its drain to the match line (ML) 306 to drive the match line (ML) 306 "high."

However, if the PCH signal is "high" indicating a pre-charge should occur, but either the VALID signal, or the TYPE SELECT signal is "low," the PRE# signal will be "high," turning the p-channel transistor (MPP2) 320 OFF. To ensure the match line (ML) 206 is not left "high" from a previous compare, discharge circuitry 307 is provided to discharge the match line (ML) 306 when MPP2 320 is OFF. If the PCH signal is "high" indicating a pre-charge should occur, but either of the VALID or TYPE SELECT signals are "low" the output of NAND gate logic 324 is high, and the DIS signal output of AND gate logic 326 will therefore be "high," turning ON an n-channel transistor (MND2) 322, and discharging the match line (ML) 206 to a reference potential (e.g., ground). If the PCH signal, and both the VALID and TYPE SELECT signals, are "high," then the DIS signal will be "low," placing MND2 in a high impedance state, and permitting the match line (ML) 306 to be precharged. Those skilled in the art will recognize that this functionality is not limited to the implementation shown in FIG. 3, and may be implemented in many equivalent manners, for example, the VALID and TYPE SELECT could be coupled to an OR gate with inverted inputs, the output of the OR gate being coupled to one input to a two-input NAND gate, and using the PCH signal as the other input, to create a DIS signal appropriate to drive a p-channel transistor in place of the n-channel transistor (MND2) 322 shown in FIG. 3.

In this manner, a pre-charge/discharge decision to a given match line associated with a TCAM entry is controlled based on whether the entry is valid and based on whether a type field matches the "type" of search being conducted. The match line (ML) 306 is not charged, only to be subsequently discharged for a miss, if either the VALID or TYPE SELECT signals are not present. For the reasons presented above, this technique could reduce the maximum power consumed in the compare operation for entries in the TCAM. Embodiments, however, are not limited to the particular logic architecture illustrated in FIG. 3, for example, according to one embodiment of the present disclosure, a precharge/valid cell is implemented integral with a match line cell (MLC).

Figure 4:
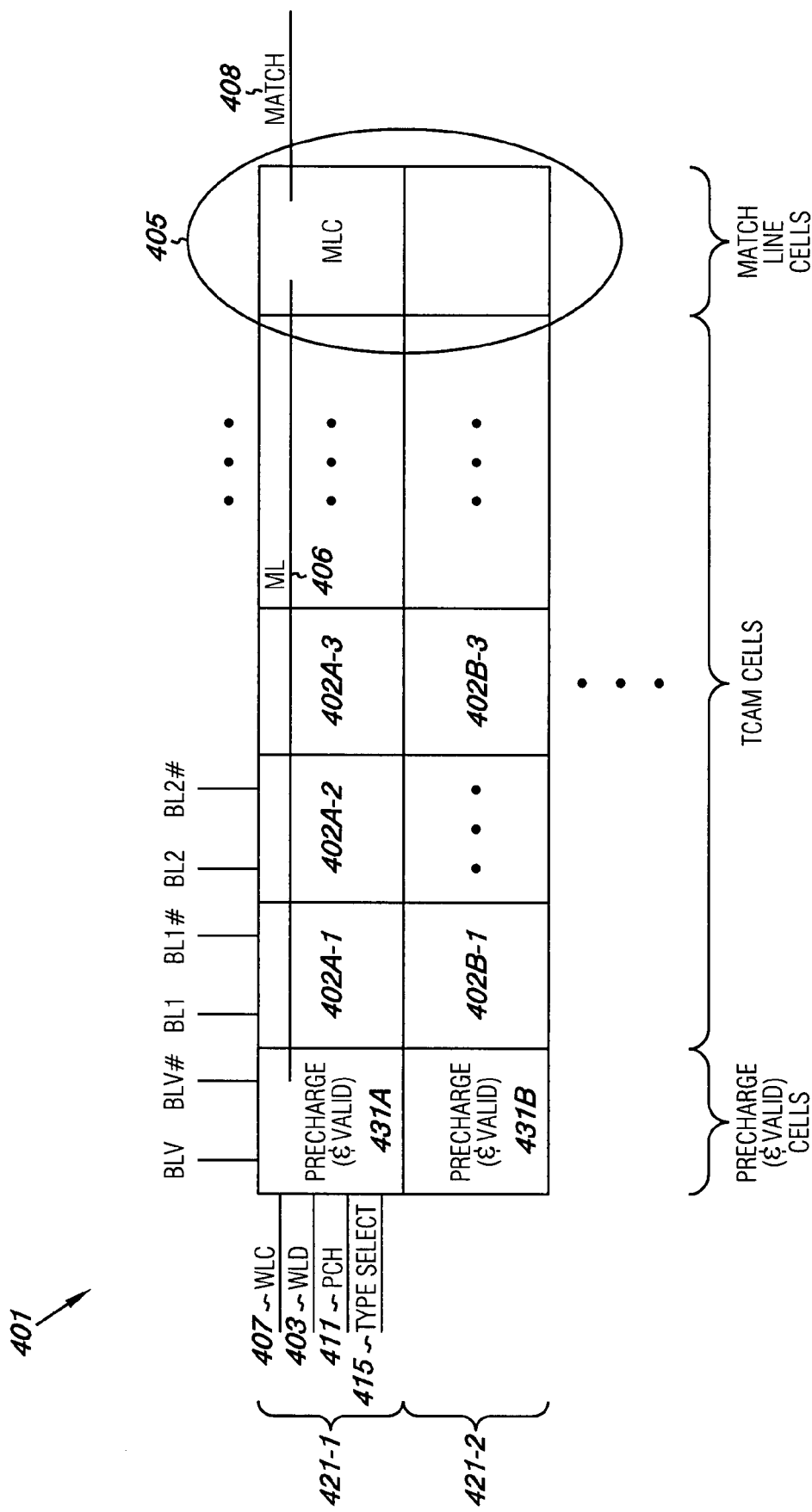
FIG. 4 illustrates an embodiment of TCAM storage cells using a type select input according to embodiments of the present invention.

FIG. 4 illustrates TCAM storage cells according to embodiments of the present disclosure. As shown in FIG. 4 several TCAM entries, 421-1, 421-2, etc., including a number of TCAM cells, e.g., 402A-1, 402A-2, . . . , 402B-3, etc., are arranged in rows, A, B, etc. Each cell, 402A-1, 402A-2, . . . , 402B-3, etc., in an entry, e.g., 421-1 and/or 421-2, etc., has its own bit line pair, BL1-BL1#, BL2-BL2#, . . . BLN-BLN#, while sharing the same word lines, e.g., word lines for "data" and for "care" (e.g., "valid") as described above and illustrated here as WLD 403 and WLC 407, with the same match line (ML) 406. In the symbolic block diagram in FIG. 4, each row, e.g., TCAM entry 421-1, 421-2, etc., of the TCAM array 401 is associated with precharge (and optionally, valid) cells 431A, 431B, etc., a MLC 405. A TCAM array can be further associated with a priority encoder, i.e., in place of the RAM array 112 in FIG. 1B, which determines and encodes the address of the highest priority matching entry (e.g., ordered in priority so if multiple matches occurred they are arranged in order, the most extensive match being selected as having the highest priority), 421-1, 421-2, etc., of the TCAM storage system.

As shown in the embodiment of FIG. 4, the TCAM storage unit 401, further includes for a given TCAM entry, associated with a match line (ML) 406, which can be part of a MLC, e.g., 405, circuit (described in connection with FIG. 1E), a PCH signal input 411 and a TYPE SELECT signal input 415. According to various embodiments, the WLD 403 and the WLC 407 word lines allow writing and reading the VALID bit, data entry, and care entries. The VALID signal, the PCH signal 411, and a TYPE SELECT signal 415 control the precharging and discharging of the match line (ML) of a given TCAM entry, e.g., 421-1, 421-2, etc., before a compare operation begins. The match line (ML) is shared with other TCAM cells, e.g., 402A-1, 402A-2, . . . , etc., in the same entry, e.g., 421-1.

As noted above, the reader will appreciate that various embodiments described herein can be performed by application specific integrated circuit (ASIC) logic (e.g., hardware in the form of transistor gates, etc.) shown herein or otherwise. Unless explicitly stated, the methods of the various embodiments described herein are not constrained to a particular order or sequence. Additionally, some of the described methods of the various embodiments can occur or be performed at the same point in time.

Figure 5:
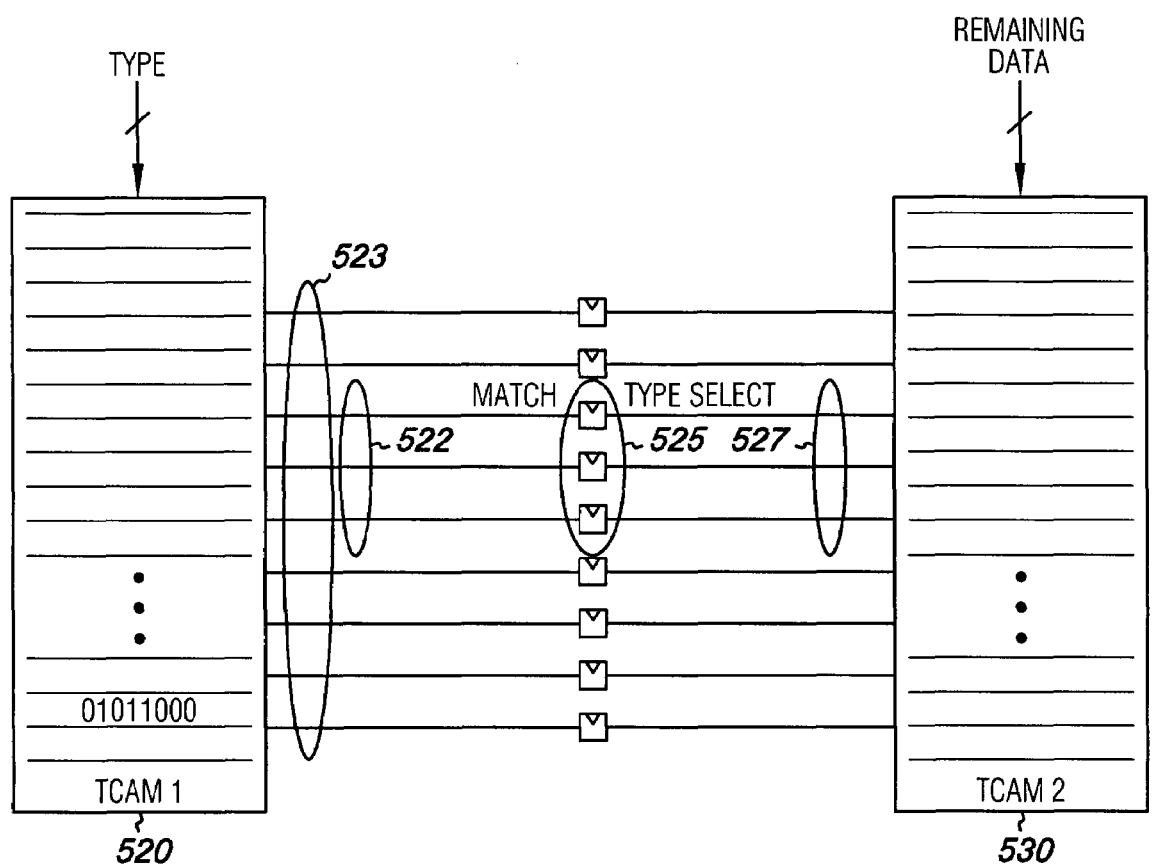
FIG. 5 illustrates an embodiment for dividing a TCAM into a first portion and a second portion using a "type field" according to embodiments of the present invention.

FIG. 5 illustrates an embodiment for using a "type field" in connection with a TCAM. Using a "type field" in connection with a TCAM can, for example, reduce power consumption of the TCAM during compare operations. In the embodiment shown in FIG. 5, the method includes dividing a TCAM into a first portion 520 and a second portion 530. The first portion 520 includes the type field of a given entry and the second portion 530 includes a remainder of the given entry. According to embodiments, logic can execute to first perform a compare operation on the type entries to the first portion 520 of the TCAM, using the results of the first compare operation to modify precharging match lines in the second portion in preparation for the second compare operation. One of ordinary skill in the art will appreciate the manner in which logic can be configured to first perform this compare operation on the type entries in the first portion 520 based on the type of search that is being conducted. One of ordinary skill in the art will also appreciate the manner in which a TCAM (and TCAM entries) can be divided into multiple (e.g., more than 2) portions, and logic can be configured to limit precharging of subsequent TCAM portions in a cascading search fashion based on the search results of prior portions.

As shown in the embodiment of FIG. 5, logic and wiring can be provided to precharge only the match lines, e.g., 522, from among the number of match lines 523 associated with all the entries containing remaining entry data in the second portion 530 of the TCAM to continue with a compare operation of the remaining entry data in the second portion 530.

For example, as shown in FIG. 5, the output signal on the match lines 523 coming from the first portion 520 of the TCAM providing the result of the "type" information compare associated with each entry in the second portion 530 could be a high or low logic, and additional logic circuitry, e.g., 525, may be employed to change the logic input 527 (i.e., a TYPE SELECT input) being provided from MATCH lines to certain entries in the second portion 530 of the TCAM. The reader will appreciate that embodiments described herein are not limited to the particular logic chosen and/or to the logic examples given herein.

The matches from TCAM 1, e.g., 520, become the "type select" input to TCAM 2, e.g., 530, which control whether the match lines in TCAM 2 are precharged or not. Hence, operation of the embodiment described in connection with FIG. 5 includes performing a compare operation based on a value of the type field information placed in a first portion 520 of a TCAM and then only pre-charging specific match lines, e.g., 522, associated with the entries when an entry is valid and based on a match to the value of the type field. All other match lines, i.e., that are not valid or did not match the type field, will be discharged, and not pre-charged, before the compare operation in the second portion 530 begins. In various embodiments, performing the compare operation based on the value of the type field in the first portion 520 is performed before, e.g., one cycle, performing a compare operation on the remainder of the given entry in the second portion 530. Dividing the TCAM into two TCAMs conserves power because the highly capacitive match lines in TCAM 2 are only charged, and possibly discharged, for the entries that have the type of entry being searched. In other words, match lines for searching the remaining portion of particular TCAM entries (contained in TCAM 2) are not wastefully precharged when a search of the type field portion of the respective TCAM entries (contained in TCAM 1) already does not match. The power drain due to the capacitive charging and discharging of match lines is not as significant in TCAM 1 because the width of the type field portion of a TCAM entry used for a TCAM 1 search is much more narrow relative to the width of the remaining data fields of a TCAM entry being searched in TCAM 2.

As the reader will appreciate, the compares operations can be performed using logic as the same has been described herein and/or other suitable techniques.

Figure 6:
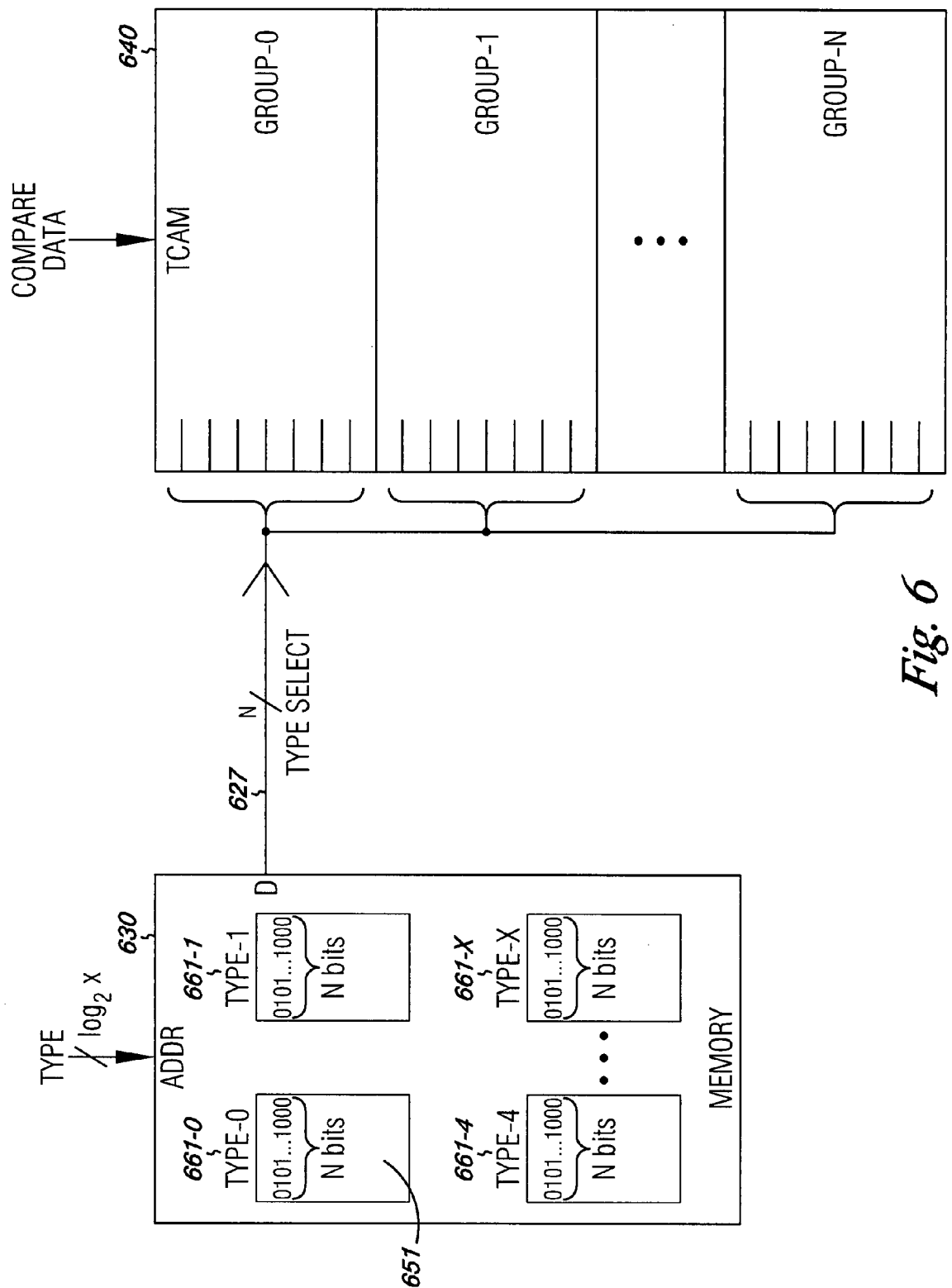
FIG. 6 illustrates an embodiment for dividing a TCAM into a number of different groups, each group having a number of entries and a type select input according to embodiments of the present invention.

FIG. 6 illustrates another embodiment for using a type field in connection with a TCAM. Using a type field in connection with a TCAM can reduce power consumption of the TCAM during compare operations. In this embodiment, a TCAM is divided into "N" groups. Each group will have a search enable input 627, e.g., a TYPE SELECT input. According to embodiments, a given group size can vary from 1 entry to the entire TCAM. In one embodiment, the method includes dividing the TCAM into a number of different groups, e.g., group 0, group 1, . . . , group N. As noted, each group can include a number of entries, which may be the same or different than other groups, and range from 1 to M entries. In one embodiment, a TCAM is a 2K (2048 entry) TCAM and the groups are divided into equal entries which include sixteen (16) entries in each group for the associated 128 groups (i.e., M=16 and N=128 for this embodiment). In this embodiment, a 128 bit group enable bus 627, e.g., with 128 TYPE SELECT inputs, is coupled to the TCAM 640 and each bit, e.g., "type select bit," of the 128 bit group enable bus (TYPE SELECT inputs) represents whether any of the sixteen (16) entries in a TCAM group, e.g., group 0, group 1, . . . , group N, contains an entry of the "type," e.g., has a type field matching the type of entry being searched. If the "type select bit" corresponding to a particular group is not set, all, e.g., 16, entries belonging to that group will not have their associated MATCH line pre-charged (and possibly discharged were a miss to occur), similar to if the entries were not valid.

According to this embodiment, the TCAM may be divided by logic into the number of different groups upon chip fabrication or the chip may include logic to respond to executable instructions to divide, e.g., organize, the TCAM into the number of different groups, each having a particular number of entries, upon use in the field. In this embodiment, a number of group enable bits are generated for each group based on the number of entries in the group and based on examining the type field of each entry as entries are written into each group. As the reader will appreciate, the group enable bits may be determined, e.g., generated for storage in memory 630, by hardware, e.g., firmware logic executing instructions, software, and/or a combination thereof.

In this embodiment, computer executable instructions storable on a memory and executable by a processor can be executed to divide the TCAM into a number of different groups, each group having a number of entries and a type select input circuitry thereto. In various embodiments, computer executable instructions are executed to generate a number of group enable bits for each different value to the type field. Instructions can execute to store the number of group enable bits 651 in memory 630, e.g., in RAM. In various embodiments, the group enable bits 651 are generated and stored according to type, e.g. Type 0, Type-1, Type 4, . . . , Type-X, etc., e.g., 661-0, 661-1, 661-4, . . . , 661-X as shown in FIG. 6. Thus, as shown in FIG. 6, in processing a network packet instruction can execute to perform a compare operation for a particular type search, e.g. Type 0, Type-1, Type 4, . . . , Type-X, etc. responsive to a TYPE input signal. For X number of search types, a TYPE input signal bit width of $\log_2(X)$ bits, i.e., base 2 log of X, is needed to encode the search type being executed.

The group enable bits 651 that have been stored in connection with each group of (16) entries, including 1 bit representing each group, for the associated 128 groups, are examined for a logic "1" or "0." Group enable bits for the selected search type can then be read from the memory 630 and output to the 128 bit group enable bus 627, coupled to the TCAM 640, as a logic "1" or "0" "type select bit" on each corresponding TYPE SELECT input 627 to either enable or disable a pre-charge/discharge of the MATCH lines associated with the 16 entries in each particular group of TCAM entries, e.g., group 0, group 1, . . . , group N. In this manner, match lines associated with entries for a given group among the groups, group 0, group 1, . . . , group N, will only be pre-charged (and subject to subsequent discharging) if the given group contains an entry of the "type," e.g., has a type field matching, that is being searched in connection with the packet. If "type select bit" is not set for a particular group, all 16 entries belonging to that group will not have their associated MATCH line pre-charged (and in fact will be discharged without precharging), similar to if the entries were not valid.

In various embodiments, the group enable bits are generated external to the memory shown in FIG. 6 as the TCAM entries are written, and after being determined elsewhere, 1 bit per group are stored in memory 630 for each respective search type as shown. Embodiments, however, are not limited to this example. Those having ordinary skill in the relevant art will recognize there are several ways to generate, maintain, store and update the group enable bits corresponding to the TCAM entries, number of groups and types of searches, e.g., implemented in hardware or software from a table that maintains information concerning the type field for every each entry in the group.

As the reader will appreciate, if only certain entries are looked at, i.e., compared, based on a field type, then significant power savings can be achieved because all the entries not being compared based on the type select will not have the match lines charged and discharged. In various embodiments the logic and/or processor instructions described herein can execute the instructions to look at a type field and the group enable bits to determine which match lines are to be pre-charged, and which are to be discharged without precharging.

In various embodiments, the "type field" in the TCAM entry is looked at and a "group enable" set of bits is generated for each different value of the type field. In certain embodiments, the type field will be limited to a certain number of type fields. As such, when a compare operation is performed the corresponding "group enable" bits for that type field would be selected to be sent, e.g., via bus 627 (TYPE SELECT) to the TCAM 640. Because of timing reasons, the type select bits must be read from the memory 630 so the group enable bits may be provided by the TYPE SELECT inputs 627 to the TCAM 640 at the same time as the compare data for a compare operation in the TCAM 640.

Hence, operation of the present embodiment includes performing a compare operation based on a value of the type field 651 as stored in a memory 630 separate but connected to the TCAM 640. The method includes accessing the value 651 of the type field for each entry in the group enable bits determined in connection with each entry among the various groups, group 0, group 1, . . . , group N, based on the type of search, e.g., TYPE-0, TYPE-1, TYPE-4, . . . , TYPE-X, being performed in association with a particular packet. The method further includes providing a type select bit to each TYPE SELECT input 627 corresponding whether any one of the number group enable bits determined in connection with each entry for the various groups included the value of the type field.

As the reader will appreciate, the power reduction achievable will be dependent on how many different types, TYPE-1, TYPE-2, TYPE-4, . . . , TYPE-X, are contained within the different groups. If each group only contains 1 type of search, the group will be searched a maximum of once per packet. If a group contains T different types of entries, the group could be searched T times per packet. Accordingly, it may be advantageous to keep the number of types of entries within a group low. In some embodiments, if the number of types within a group is kept to a single type then the type field can be entirely eliminated from the TCAM 640.

Software, e.g., computer executable instructions, can be used to arrange entries into groups or select groups based on entries to achieve searching efficiencies. There may be a tradeoff between the size of the groups, e.g., the number of entries in each group (there being more flexibility and less power consumption with a larger number of groups having fewer entries in each group), with the amount of resources used to implement a larger number of groups, e.g., the number of bits used to store group enable bits for each group, and wiring and logic for manipulating and communicating the larger number of group enable bits.

In some embodiments, executable instructions will be provided that can be executed to maintain the group enable bits per type. This may involve additional software instruction coding to provide, potentially, a lot of storage in the group enable bits, e.g. reflective of the number of types multiplied by the number of groups, with potentially less flexibility to realize the fullest amount of power savings, e.g., as in the case of having only one (1) type per group.

In some embodiments, the TCAM could also be divided up physically into multiple smaller TCAMs and the group enable bits, associated with each entry in a group, and could then additionally be used to enable compares on the smaller individual TCAMS. These embodiments would then be somewhat similar to having a smaller TCAM for each group, as mentioned earlier, but without the loss of flexibility for a customer's particular network needs. That is, each TCAM could still dynamically assign multiple types of searches among the various groups according to searches relevant to a particular network application. It may, however, not be sensible to make the number of groups in a particular TCAM too small, e.g., less than 64-128 groups, due to inefficiencies resulting from less flexibility attained by using the type select inputs with smaller groups.

One of ordinary skill in the art will appreciate that the embodiments described herein for using a "type field" can provide improved techniques for conserving power when locating bits that are fairly random in systems other than a CAM and/or TCAM.

Figure 7:
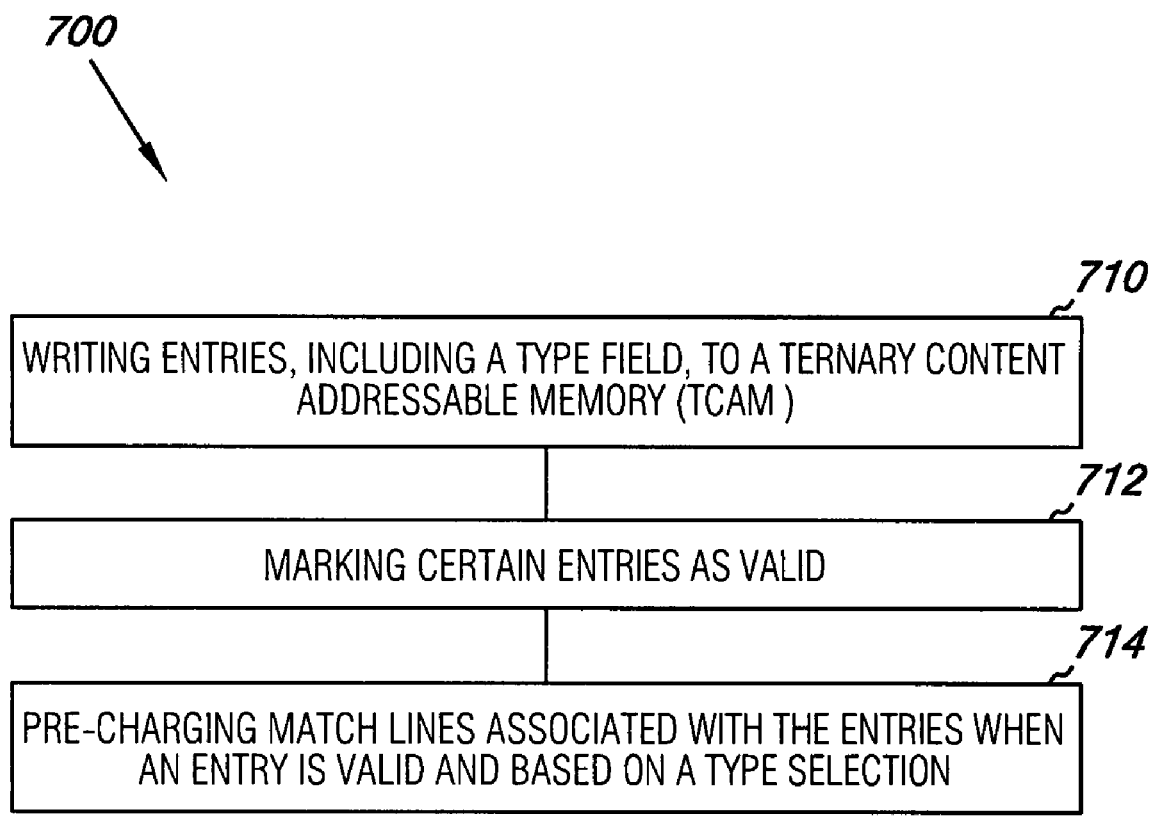
FIG. 7 illustrates a method embodiment for using type field information in association with a CAM cell.

FIG. 7 illustrates a method embodiment for a content addressable memory (CAM). The method includes logic to write entries, including a type field, into a ternary CAM (TCAM), as shown at block 710. Block 712 illustrates that logic can operate to mark certain entries as valid. Block 714 illustrates that logic will operate to pre-charge match lines associated with the entries when an entry is valid and based on a type selection.

For example, in some embodiments logic waits for it to be time to pre-charge match lines in a TCAM in preparation for a compare operation. When it is time to pre-charge the match lines in preparation for the compare operation, the logic determines whether to mark an entry valid. The logic determines if an entry's type field matches the type of entry selected, e.g., for a compare operation of the balance of that entry. If it is time to pre-charge match lines in preparation for a compare operation, and the entry is marked valid and its type field matches the type of entry selected, then that entry's match line is pre-charged in preparation for a compare operation.

If the entry is not marked valid, or its type field does not match the type of entry selected, then that entry's match line is discharged in preparation for the compare operation since that entry is of the wrong type or not valid and thus will not result in a match. As one skilled in the art will appreciate, energy is saved by not pre-charging the match lines of entries which are known before the compare will not result in a match, and the match lines of these non-matching entries are discharged to remove any lingering match indication, e.g., from a previous compare.

The logic, which is operable to perform the method described in connection with FIG. 7 can be present in whole or in part in embodiments of other Figures, e.g., in the pre-charge (& valid) cells of FIGS. 1A and 4, within TCAM 2 530 of FIG. 5, and within the TCAM 640 of FIG. 6. Embodiments, however, are not limited to the example given herein.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the embodiments of the disclosure require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method for content addressable memory (CAM), comprising:
   writing entries, including a type field in each entry, to ternary CAM (TCAM) cells of a TCAM, thereby storing the entries including the type fields in the TCAM cells;
   marking certain entries as valid;
   pre-charging match lines associated with the entries when an entry is valid and based on a type selection and the type fields stored in the TCAM cells;
   dividing the TCAM into a number of different groups, each group having a number of entries and a type select input;
   generating a number of group enable bits for each group based on the number of entries in the group and based on examining the type field of each entry as entries are written into each group;
   generating the number of group enable bits for each different value to the type field; and
   storing the number of group enable bits for each different value to the type field in a separate memory.

2. The method of claim 1, wherein the method includes:
   performing a compare operation based on a value of the type field;
   accessing the value of the type field in the separate memory; and
   providing a type select bit to each type select input corresponding to whether the number group enable bits for each group included the value of the type field.

3. The method of claim 2, wherein the method further includes:
   dividing the TCAM up physically into a number of smaller TCAMs;
   generating a number of group enable bits for each of the number of smaller TCAMs and each group within the number of smaller TCAMs; and
   using the group enable bits to additionally, individually enable a compare operation among the number of smaller TCAMs.

4. The method of claim 2, wherein the method includes increasing a compare to results latency by one cycle.

5. The method of claim 1, wherein dividing the TCAM into the number of different groups includes limiting each group to a single type and eliminating the type field from the TCAM entries.

6. The method of claim 1, wherein the method includes dividing the TCAM into a first portion and a second portion, wherein the first portion includes the type field of a given entry and the second portion includes a remainder of the given entry.

7. The method of claim 6, wherein the method includes:
performing a compare operation based on a value of the type field;
pre-charging match lines in the second portion associated with the entries when an entry is valid and based on a match to the value of the type field.

8. The method of claim 7, wherein the method includes performing the compare operation based on the value of the type field one cycle before performing a compare operation on the remainder of the given entry.

9. A ternary content addressable memory (TCAM) system, comprising:
a TCAM array including a number of TCAM cells arranged in rows and columns, each row of the TCAM array having a data word line (WLD), a care word line (WLC), and a match line (ML) associated therewith, and wherein each row of TCAM cells in the TCAM array represents an entry including a type field;
a match logic circuit (MLC) coupled to the TCAM;
a valid/precharge cell including pre-charge input, a valid input, and a type select input associated therewidth;
wherein logic associated with the valid/precharge cell is able to control a pre-charge and discharge of the match line based on a valid entry to a TCAM cell and based on a type field stored in the TCAM cells and associated with the type input; and
dividing the TCAM into a number of different groups, each group having a number of entries and a type select input;
generating a number of group enable bits for each group based on the number of entries in the group and based on examining the type field of each entry as entries are written into each group;
generating the number of group enable bits for each different value to the type field; and
storing the number of group enable bits for each different value to the type field in a separate memory.

10. The TCAM system of claim 9, wherein the TCAM is divided into a number of groups, each group having a number of entries, and wherein a different type select input is associated with each one of the number of groups.

11. The TCAM system of claim 10, wherein the TCAM system further includes a separate memory coupled to the TCAM array, the separate memory including group enable bits for each group based on the number of entries in each group.

12. The TCAM system of claim 11, wherein the system includes a processor coupled to the memory, the memory including computer executable instructions stored thereon and executable by the processor to generate the group enable bits based on an examination of the type field in each entry as the entries are written into each group.

13. The TCAM system of claim 12, wherein the computer executable instructions can be executed to generate different group enable bit tables for each group relative to each different type field present among the number of entries.

14. The TCAM system of claim 13, wherein the computer executable instructions can be executed to perform a type compare of the group enable bits for a particular type value and provide a type select bit to the type input associated with a particular group, each type select input corresponding to whether the number of group enable bits for each group included a value of the type being searched.

15. The TCAM system of claim 14, wherein the TCAM array is physically divided into a number of smaller TCAMs, and wherein the computer executable instructions are executed to:
generate the number of group enable bits for each of the number of smaller TCAMs and for each group within the number of smaller TCAMs; and
use the group enable bits to additionally, individually enable a compare operation among the number of smaller TCAMs.

16. A method for content addressable memory (CAM), comprising:
writing entries, including a type field, to a ternary CAM (TCAM);
marking certain entries as valid;
pre-charging match lines associated with the entries when an entry is valid and based on a type selection and the type fields wrote in the TCAM cells;
dividing the TCAM into a number of different groups, each group having a number of entries and a type select input; and
generating a number of group enable bits for each group based on the number of entries in the group and based on examining the type field of each entry as entries are written into each group; generating the number of group enable bits for each different value to the type field; and storing the number of group enable bits for each different value to the type field in a separate memory.

17. The method of claim 16, wherein the method further comprises:
generating the number of group enable bits for each different value to the type field; and
storing the number of group enable bits for each different value to the type field in a separate memory.

* * * * *

UNITED STATES PATENT AND TRADEMARK OFFICE
CERTIFICATE OF CORRECTION

PATENT NO. : 7,602,629 B2  Page 1 of 1
APPLICATION NO. : 11/787588
DATED : October 13, 2009
INVENTOR(S) : John A. Wickeraad It is certified that error appears in the above-identified patent and that said Letters Patent is hereby corrected as shown below:

In column 15, line 30, in Claim 9, delete "therewidth;" and insert -- therewith; --, therefor.

Signed and Sealed this

Seventeenth Day of August, 2010

David J. Kappos
*Director of the United States Patent and Trademark Office*